US012622090B2

(12) United States Patent　　(10) Patent No.:　US 12,622,090 B2
Li et al.　　(45) Date of Patent:　May 5, 2026

(54) SOLAR CELL STRUCTURE, METHOD FOR PREPARING SOLAR CELL, AND MASK PLATE

(71) Applicant: TRINA SOLAR CO., LTD., Changzhou (CN)

(72) Inventors: Hongwei Li, Changzhou (CN); Guangtao Yang, Changzhou (CN); Daming Chen, Changzhou (CN); Yifeng Chen, Changzhou (CN)

(73) Assignee: TRINA SOLAR CO., LTD., Changzhou (CN)

( * ) Notice: Subject to any disclaimer, the term of this patent is extended or adjusted under 35 U.S.C. 154(b) by 0 days.

(21) Appl. No.: 18/757,286

(22) Filed: Jun. 27, 2024

(65) Prior Publication Data

US 2024/0347651 A1　　Oct. 17, 2024

(30) Foreign Application Priority Data

Mar. 15, 2024　　(CN) .......................... 202410301160.3

(51) Int. Cl.
H10F 77/20　　(2025.01)

(52) U.S. Cl.
CPC ......... H10F 77/244 (2025.01); H10F 77/219 (2025.01)

(58) Field of Classification Search
CPC ..... H10F 77/219; H10F 77/244; H10F 77/315
See application file for complete search history.

(56) References Cited

U.S. PATENT DOCUMENTS

| | | | |
|---|---|---|---|
| 2011/0265870 A1* | 11/2011 | Park ...................... | H10F 77/211 136/256 |
| 2012/0318336 A1* | 12/2012 | Hekmatshoar-Tabari ................... | H10F 77/219 257/E31.034 |
| 2013/0228221 A1 | 9/2013 | Moslehi et al. | |
| 2015/0144184 A1 | 5/2015 | Ballif et al. | |

FOREIGN PATENT DOCUMENTS

| | | |
|---|---|---|
| CN | 108511553 A | 9/2018 |
| CN | 109659393 A | 4/2019 |
| CN | 112687766 A | 4/2021 |
| CN | 113328010 A | 8/2021 |
| CN | 113380926 A | 9/2021 |

(Continued)

OTHER PUBLICATIONS

CN 112687766 A English Translation provided by FIT database, translated on Oct. 31, 2025.*

(Continued)

*Primary Examiner* — Golam Mowla
(74) *Attorney, Agent, or Firm* — MARSHALL, GERSTEIN & BORUN LLP

(57) ABSTRACT

A solar cell structure, a method for preparing a solar cell, and a mask plate. The solar cell structure includes a substrate, a first doped layer, and a plurality of first transparent conductive layers. The first doped layer is disposed on a surface of the substrate. The plurality of first transparent conductive layers are spaced apart from each other and disposed on a surface of the first doped layer away from the substrate. A region to be cut of the solar cell structure is located between two adjacent first transparent conductive layers.

11 Claims, 10 Drawing Sheets

(56)        References Cited

FOREIGN PATENT DOCUMENTS

| | | | |
|---|---|---|---|
| CN | 114068731 | A | 2/2022 |
| CN | 114628546 | A | 6/2022 |
| CN | 114927597 | A | 8/2022 |
| CN | 116174942 | A | 5/2023 |
| JP | 2012-256686 | A | 12/2012 |
| JP | 2015198142 | A | 11/2015 |
| JP | 6619273 | B2 | 12/2019 |
| WO | WO-2019/189267 | A1 | 10/2019 |

OTHER PUBLICATIONS

Office Action, Chinese Patent Application No. 202410301160.3, dated Dec. 21, 2024.
Office Action, Australian patent application No. 2024204652, dated Aug. 29, 2024.
Office Action, Japanese Patent Application No. 2024-092720, dated Jul. 15, 2025.
Office Action, Japanese Patent Application No. 2024-092720, dated Apr. 1, 2025.

* cited by examiner

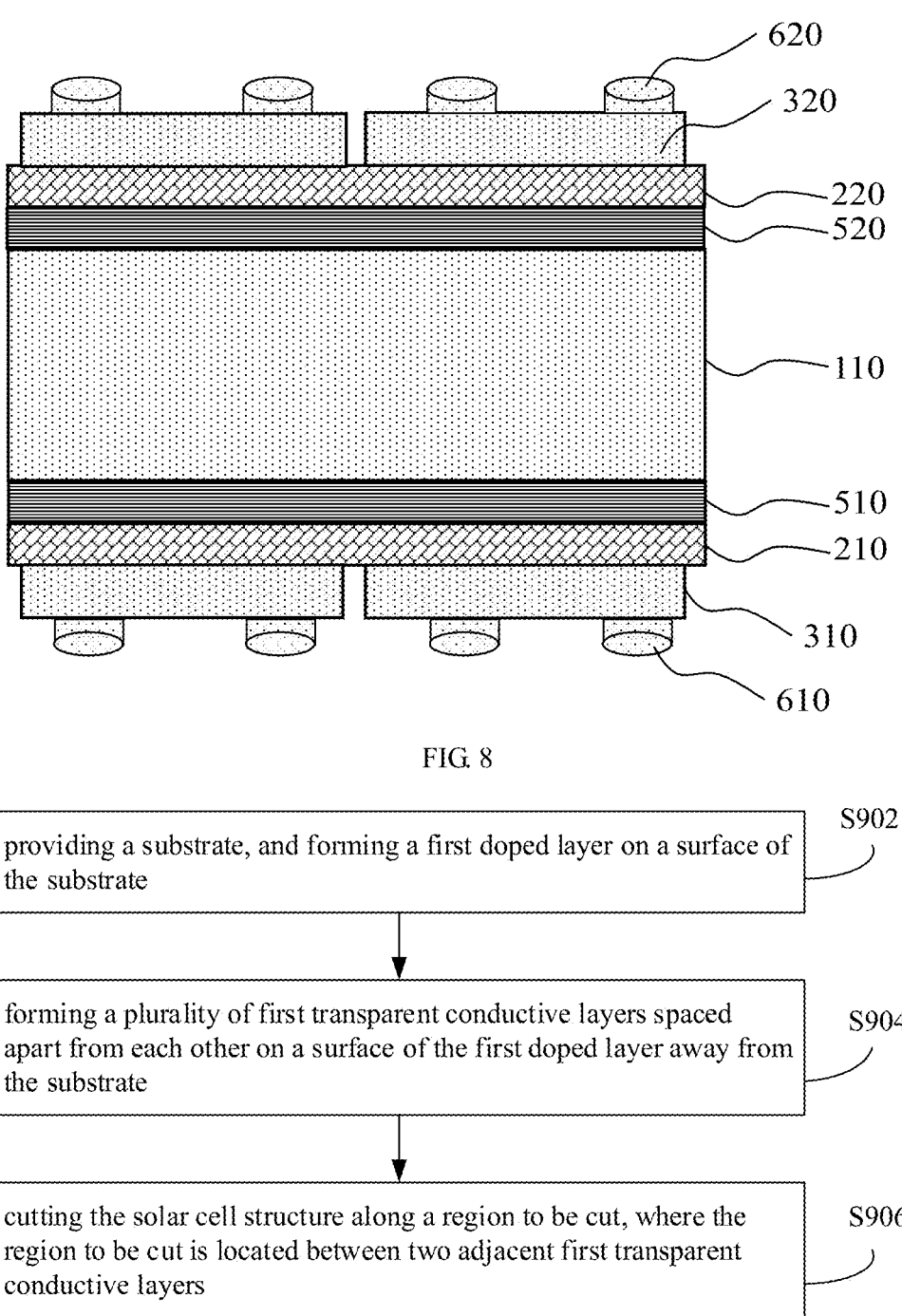

FIG. 8

| providing a substrate, and forming a first doped layer on a surface of the substrate | S902 |
|---|---|

| forming a plurality of first transparent conductive layers spaced apart from each other on a surface of the first doped layer away from the substrate | S904 |
|---|---|

| cutting the solar cell structure along a region to be cut, where the region to be cut is located between two adjacent first transparent conductive layers | S906 |
|---|---|

FIG. 9

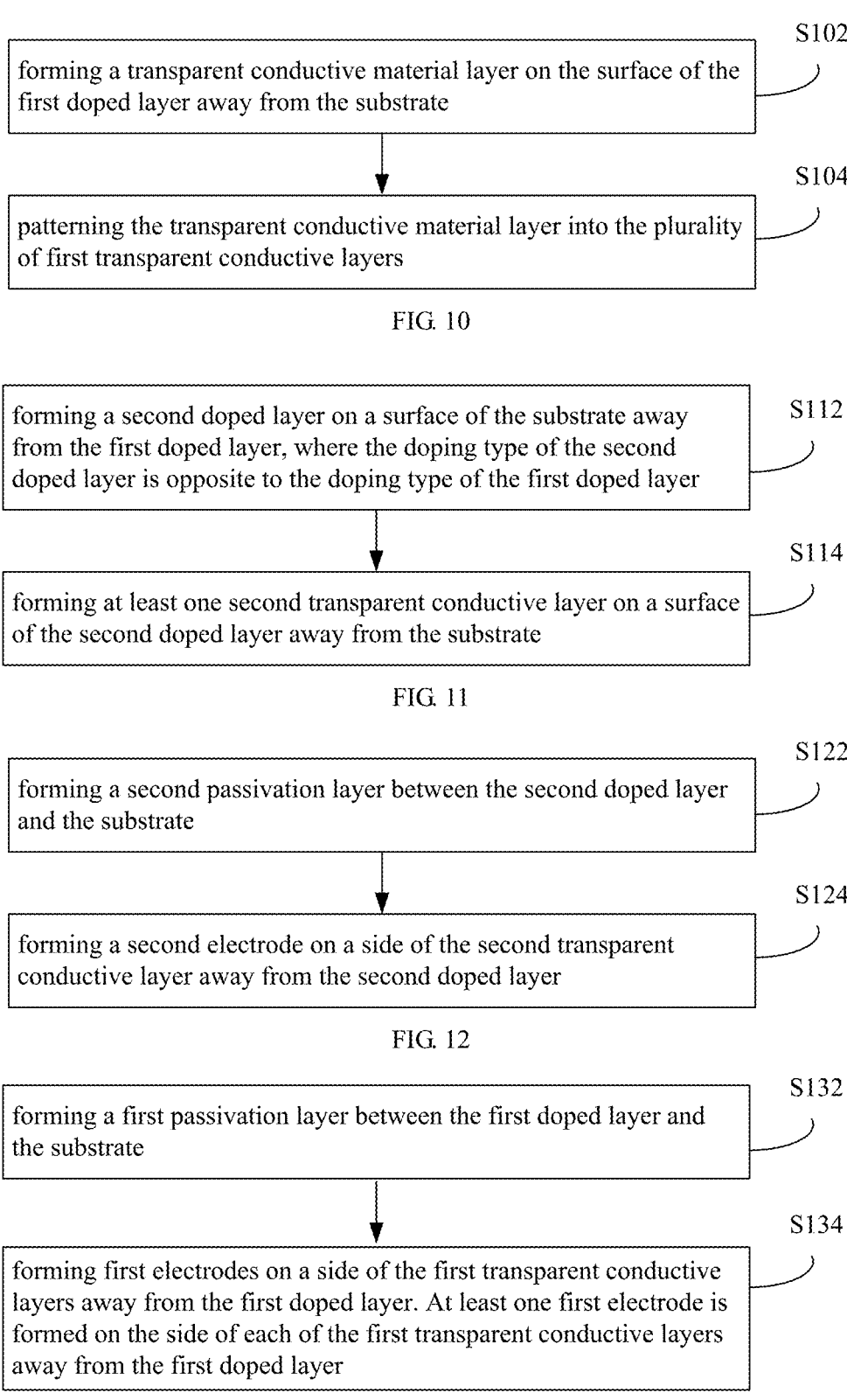

S102 forming a transparent conductive material layer on the surface of the first doped layer away from the substrate

S104 patterning the transparent conductive material layer into the plurality of first transparent conductive layers

FIG. 10

S112 forming a second doped layer on a surface of the substrate away from the first doped layer, where the doping type of the second doped layer is opposite to the doping type of the first doped layer

S114 forming at least one second transparent conductive layer on a surface of the second doped layer away from the substrate

FIG. 11

S122 forming a second passivation layer between the second doped layer and the substrate

S124 forming a second electrode on a side of the second transparent conductive layer away from the second doped layer

FIG. 12

S132 forming a first passivation layer between the first doped layer and the substrate

S134 forming first electrodes on a side of the first transparent conductive layers away from the first doped layer. At least one first electrode is formed on the side of each of the first transparent conductive layers away from the first doped layer

710 opening

720

710 opening

SOLAR CELL STRUCTURE, METHOD FOR PREPARING SOLAR CELL, AND MASK PLATE

CROSS-REFERENCE TO RELATED APPLICATION

This application claims priority to Chinese patent application No. 202410301160.3, filed on Mar. 15, 2024, and titled "SOLAR CELL STRUCTURE, METHOD FOR PREPARING SOLAR CELL, AND MASK PLATE", the content of which is hereby incorporated herein in its entirety by reference.

TECHNICAL FIELD

The present application relates to the field of photovoltaic technology, particularly relating to a solar cell structure, a method for preparing a solar cell, and a mask plate.

BACKGROUND

With the rapid development in photovoltaic technology, the conversion efficiency of crystalline silicon solar cells has been continuously increasing over the years. For instance, solar cells employing heterojunction technology (HJT) have achieved impressive conversion efficiencies of up to 26.81%. Moreover, the heterojunction back contact (HBC) solar cells, based on heterojunction structures, have set a new world record with an efficiency of 27.09% for monocrystalline silicon solar cells, attracting great attentions towards heterojunction cells. Heterojunction solar cells, as n-type double-sided cells, offer numerous advantages including simple process flow, high efficiency, low temperature coefficient, energy savings throughout the entire low-temperature process, absence of light-induced degradation (LID) and light and elevated temperature induced degradation (LeTID) issues, suitability for thinner applications, excellent performance under weak light conditions, etc. Furthermore, HJT is an ideal bottom cell technology for ultra-high efficiency silicon-based tandem cells in the future. Hence, HJT continues to be a focus of research and industry attention in the photovoltaic field.

In related art, to meet the increasing power requirements of photovoltaic modules, HJT cells are cut using lasers to create half cells, which are then welded and interconnected in parallel to form photovoltaic modules. However, the laser cutting process can generate laser damage zones and mechanical fracture zones on the solar cells, resulting in loss of solar cell efficiency.

SUMMARY

According to an aspect of the present application, a solar cell structure includes: a substrate; a first doped layer disposed on a surface of the substrate; and a plurality of first transparent conductive layers spaced apart from each other and disposed on a surface of the first doped layer away from the substrate.

A region to be cut of the solar cell structure is located between two adjacent first transparent conductive layers.

In an embodiment, the first doped layer includes a gap region and a margin region, the gap region and the margin region are exposed out from the plurality of first transparent conductive layers, and the gap region is located corresponding to a space between the two adjacent first transparent conductive layers.

In an embodiment, the solar cell structure further includes: a first non-conductive antireflection layer disposed on the surface of the first doped layer away from the substrate and located between the two adjacent first transparent conductive layers to space the two adjacent first transparent conductive layers from each other.

The size of the region to be cut between the two adjacent first transparent conductive layers is smaller than the size of the first non-conductive antireflection layer.

In an embodiment, the first non-conductive antireflection layer covers the surface of the first doped layer away from the substrate beyond the first transparent conductive layers.

In an embodiment, the plurality of first transparent conductive layers are arranged in an array, and the region to be cut extends along a row direction and/or a column direction of the array.

In an embodiment, the solar cell structure further includes: a second doped layer disposed on a surface of the substrate away from the first doped layer, wherein the doping type of the second doped layer is opposite to the doping type of the first doped layer; and at least one second transparent conductive layer disposed on a surface of the second doped layer away from the substrate.

In an embodiment, the at least one second transparent conductive layer is a plurality of second transparent conductive layers, and a projection of the plurality of second transparent conductive layers on the substrate is in alignment with a projection of the plurality of first transparent conductive layers on the substrate.

In an embodiment, the solar cell structure further includes: a second non-conductive antireflection layer disposed on a surface of the second doped layer away from the substrate and located between two adjacent second transparent conductive layers to space the two adjacent second transparent conductive layers from each other.

The size of the region to be cut between the two adjacent second transparent conductive layers is smaller than the size of the second non-conductive antireflection layer between the two adjacent second transparent conductive layers.

In an embodiment, the solar cell structure further includes: a second passivation layer disposed between the second doped layer and the substrate; at least one second electrode disposed on a side of the at least one second transparent conductive layer away from the second doped layer.

In an embodiment, the solar cell structure further includes: a first passivation layer disposed between the first doped layer and the substrate; and first electrodes disposed on a side of the plurality of first transparent conductive layers away from the first doped layer.

At least one of the first electrodes is disposed on a side of each of the plurality of first transparent conductive layers away from the first doped layer.

According to another aspect of the present application, a method for preparing a solar cell includes: providing a substrate, and forming a first doped layer on a surface of the substrate; forming a plurality of first transparent conductive layers spaced apart from each other on a surface of the first doped layer away from the substrate, thereby achieving a solar cell structure; and cutting the solar cell structure along a region to be cut, wherein the region to be cut is located between two adjacent first transparent conductive layers.

In an embodiment, forming the plurality of first transparent conductive layers spaced apart from each other on the surface of the first doped layer away from the substrate includes: forming a transparent conductive material layer on the surface of the first doped layer away from the substrate;

and patterning the transparent conductive material layer into the plurality of first transparent conductive layers.

In an embodiment, forming the plurality of first transparent conductive layers spaced apart from each other on the surface of the first doped layer away from the substrate includes: forming the plurality of first transparent conductive layers on the surface of the first doped layer away from the substrate by using a mask plate.

The mask plate includes a blocking strip, the blocking strip is configured to abut against the first doped layer to mask a gap region of the first doped layer located corresponding to a space between the two adjacent first transparent conductive layers, thereby exposing the gap region of the first doped layer out from the plurality of first transparent conductive layers.

In an embodiment, the mask plate further includes a first frame, and the first frame is configured to abut against the first doped layer to mask a margin region of the first doped layer, thereby exposing the margin region of the first doped layer out from the plurality of first transparent conductive layers.

In an embodiment, the method for preparing the solar cell further includes: forming a first non-conductive antireflection layer on the surface of the first doped layer away from the substrate, wherein the first non-conductive antireflection layer is located between the two adjacent first transparent conductive layers to space the two adjacent first transparent conductive layers.

The size of the region to be cut between the two adjacent first transparent conductive layers is smaller than the size of the first non-conductive antireflection layer.

In an embodiment, the first non-conductive antireflection layer covers the surface of the first doped layer away from the substrate beyond the first transparent conductive layers.

In an embodiment, the plurality of first transparent conductive layers are formed in an array, and cutting the solar cell structure along the region to be cut includes: cutting the solar cell structure along a row direction and/or a column direction of the array.

In an embodiment, the method for preparing the solar cell further includes: forming a second doped layer on a surface of the substrate away from the first doped layer, wherein the doping type of the second doped layer is opposite to the doping type of the first doped layer; and forming at least one second transparent conductive layer on a surface of the second doped layer away from the substrate.

In an embodiment, the method for preparing the solar cell further includes: forming a second non-conductive antireflection layer on a surface of the second doped layer away from the substrate, wherein the at least one second transparent conductive layer is a plurality of second transparent conductive layers, the second non-conductive antireflection layer is located between two adjacent second transparent conductive layers to space the two adjacent second transparent conductive layers from each other.

The size of the region to be cut between the two adjacent second transparent conductive layers is smaller than the size of the second non-conductive antireflection layer between the two adjacent second transparent conductive layers.

In an embodiment, the method for preparing the solar cell further includes: forming a second passivation layer between the second doped layer and the substrate; forming at least one second electrode on a side of the at least one second transparent conductive layer away from the second doped layer.

In an embodiment, the method for preparing the solar cell further includes: forming a first passivation layer between the first doped layer and the substrate; forming first electrodes on a side of the plurality of first transparent conductive layers away from the first doped layer.

At least one first electrode is formed on a side of each of the plurality of first transparent conductive layers away from the first doped layer.

According to yet another aspect of the present application, a mask plate includes: a first frame configured to mask a margin region of a first doped layer of a solar cell structure during forming a plurality of first transparent conductive layers on the first doped layer, thereby exposing the margin region of the first doped layer out from the plurality of first transparent conductive layers; a blocking strip configured to mask a gap region of the first doped layer located corresponding to space between two adjacent first transparent conductive layers during forming of the plurality of first transparent conductive layers, thereby exposing the gap region of the first doped layer out from the plurality of first transparent conductive layers.

A region to be cut of the solar cell structure is located in the gap region.

In an embodiment, the blocking strip extends from one edge of the frame to an opposite edge of the frame, the width of the blocking strip is greater than the width of the gap region, and the width direction is perpendicular to the extending direction of the blocking strip.

In an embodiment, the mask plate further includes a second frame enveloping the first frame, and opposite edges of the second frame includes openings or slots, through which the blocking strip is fixed to the second frame.

According to yet another aspect of the present application, a photovoltaic module includes a cell group. The cell group includes a plurality of solar cells electrically connected to each other, each of the solar cells is cut from the solar cell structure as described above or prepared by the method as described above.

According to yet another aspect of the present application, a photovoltaic system includes the photovoltaic module as described above.

The above-described solar cell structure includes a substrate, a first doped layer, and a plurality of first transparent conductive layers spaced apart from each other. Forming an integrated solar cell structure before the cell cutting can reduce the capacity burden on automation equipment and improve overall effective capacity of production equipment. Moreover, the region to be cut is located in the gap region between adjacent first transparent conductive layers. Since the gap region is not covered by any first transparent conductive layers, no conductive debris is generated during the cutting process, which can prevent the formation of electrical conducting channels in the p-n region caused by laser cutting, effectively reducing cutting-induced efficiency loss of solar cells. Furthermore, metallization on the integrated solar cell structure compared to on separate solar cells effectively increases the production capacity of metallization equipment and reduces the investment cost of gigawatt (GW) level production equipment. Therefore, the solar cell structure, the method for preparing the solar cell, the mask plate, the photovoltaic module, and the photovoltaic system described above can reduce the fixed asset investment for producing heterojunction solar cells, reduce the production costs, and reduce the solar cell efficiency loss, enhancing the power of final products.

BRIEF DESCRIPTION OF THE DRAWINGS

In order to more clearly describe the embodiments of the present application, the accompanying drawings to be used in the description of the embodiments will be described briefly. Obviously, the drawings described below are only some embodiments of the present application. For ordinary skilled persons in the art, other drawings can also be obtained based on the following drawings without creative work.

FIG. 8 is a schematic structural view of a solar cell structure in yet another embodiment.

FIG. 9 is a flow chart of a method for preparing a solar cell in an embodiment.

FIG. 10 is a flow chart of a method for preparing a solar cell in another embodiment.

FIG. 11 is a flow chart of a method for preparing a solar cell in yet another embodiment.

FIG. 12 is a flow chart of a method for preparing a solar cell in yet another embodiment.

FIG. 13 is a flow chart of a method for preparing a solar cell in yet another embodiment.

DETAILED DESCRIPTION

Figure 1:
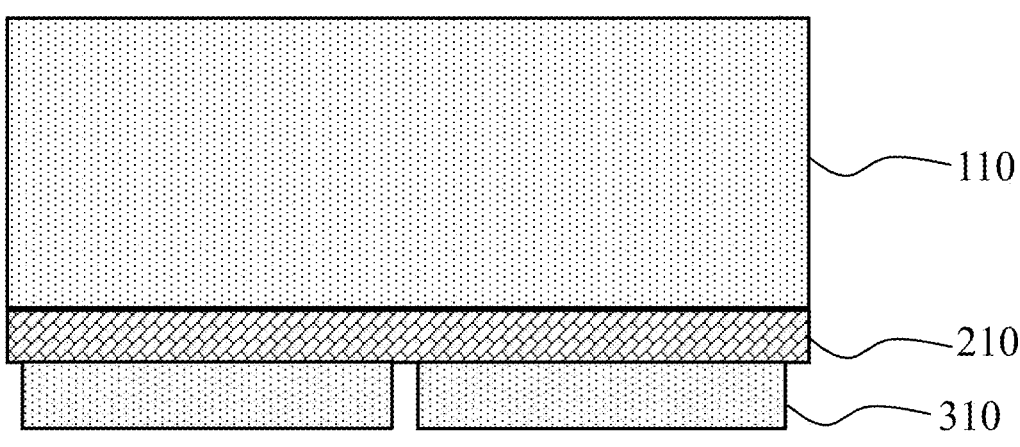
FIG. 1 is a schematic structural view of a solar cell structure in an embodiment.

To make the objectives, technical solutions, and advantages of the present application more apparent and better understandable, detailed explanations of specific embodiments are provided below with reference to accompanying drawings. It should be noted that the specific embodiments described herein are only used to explain the present application and are not intended to limit the present application.

It should be noted that the terms "first" and "second" are used merely as labels to distinguish one element having a certain name from another element having the same name, and cannot be understood as indicating or implying any priority, precedence, or order of one element over another, or indicating the quantity of the element. Therefore, the element modified by "first" or "second" may explicitly or implicitly be singular or plural. In the description of the present application, "a plurality of" means at least two, such as two, three, etc., unless otherwise specifically defined.

It should be noted that an element, when being referred to as being "located" or "disposed" to another element, may be directly located or disposed on the other element or via an intermediate element; an element, when being referred to as being "connected" to another element, may be directly connected to the other element or via an intermediate element. Unless otherwise clearly specified and defined, the terms "installed", "connected", "coupled", "fixed" and the like should be interpreted broadly. For example, an element, when being referred to as being "installed", "connected", "coupled", "fixed" to another element, unless otherwise specifically defined, may be fixedly connected, detachably connected, or integrated to the other element, may be mechanically connected or electrically connected to the other element, may be directly connected to the other element or connected to the other element via an intermediate element, or may be connected to the other element through internal communication or interaction. For those of ordinary skill in the art, the specific meanings of the above-mentioned terms in the present application can be understood according to specific circumstances.

It should be noted that unless otherwise specifically defined, an element, when being referred to as being located "on" or "under" another element, may be in direct contact with the other element or contact the other element via an intermediate element. Moreover, the element, when being referred to as being located "on", "above", "over" another element, may be located right above or obliquely above the other element, or merely located at a horizontal level higher than the other element; the element, when being referred to as being located "under", "below", "beneath" another element, may be located right below or obliquely below the other element, or merely located at a horizontal level lower than the other element.

The following will describe solar cell structures, methods for preparing solar cells, mask plates, photovoltaic modules, and photovoltaic systems in embodiments of the present application with reference to the drawings.

Referring to FIG. 1, an embodiment of the present application provides a solar cell structure. In the present embodiment, for illustrative purposes, the description is based on a HJT solar cell as an example. The solar cell structure can include a substrate 110, a first doped layer 210, and a plurality of first transparent conductive layers 310.

The substrate 110 is configured to receive incident light and generate photogenerated carriers. The substrate 110 includes a first surface and a second surface opposite to each other. One of the first surface and the second surface can be the surface facing the sun, also known as the light-receiving surface or the front surface, and the other one can be the surface facing away from the sun, also known as the back surface. In some embodiments, the light-receiving surface can have a textured structure, while part of the back surface can have a flat structure, and another part of the back surface can also have a textured structure.

The substrate 110 can be, but is not limited to, a doped semiconductor substrate, made of a material such as silicon or germanium, or a doped compound semiconductor substrate, made of a material such as silicon carbide, silicon germanium, gallium arsenide, indium phosphide, zinc oxide, or gallium oxide. For example, in the present embodiment, the material of the substrate 110 can be doped monocrystalline silicon. Furthermore, the doping type of the substrate 110 can be n-type, i.e., the substrate 10 is doped with an n-type element, such as phosphorus, arsenic, or antimony, or the doping type of the substrate 110 can be p-type, i.e., the substrate 10 is doped with a p-type element, such as boron or gallium. Moreover, the substrate 110 can be an n-type monocrystalline silicon wafer with a thickness ranging from 60 micrometers (μm) to 180 μm and an electrical resistivity ranging from 0.2 Ohm-centimeters (Ω·cm) to 3 Ω·cm.

The first doped layer 210 is disposed on a surface of the substrate 110, e.g., can be disposed on the back surface of the substrate 110. The thickness of the first doped layer 210 can be in a range from 5 nanometers (nm) to 30 nm. The first doped layer 210 can be made of doped amorphous silicon or doped microcrystalline silicon, optionally including at least one element of oxygen, carbon, or nitrogen.

The plurality of first transparent conductive layers 310 are spaced apart from each other and disposed on a surface of the first doped layer 130 away from the substrate 110, forming a hollow region between two adjacent first transparent conductive layers 310 for spacing between adjacent first transparent conductive layers 310. Optionally, the first transparent conductive layers 310 can be transparent conductive oxide (TCO) films, such as one film or multiple laminated films made of at least one of indium tin oxide (ITO), indium tungsten oxide (IWO), indium cerium oxide (ICO), indium molybdenum oxide (IMO), SCOT, aluminum doped zinc oxide (AZO), gallium doped zinc oxide (GZO), Ga—Al doped zinc oxide (GAZO), or $SnO_2$.

Optionally, the hollow region can be formed by a physical method. For example, a mask plate can be used in forming the first transparent conductive layers 310 through a deposition method to form the hollow region with a width of 0.5 millimeters (mm) to 2 mm between adjacent first transparent conductive layers 310. The mask plate will be described later. The region blocked by the mask plate can form the hollow region, and the width of the hollow region is greater than or equal to a region to be cut, e.g., with laser. Alternatively, other methods can be used to form the hollow region. For example, a TCO film can be firstly formed to completely cover the first doped layer, and then the TCO film is patterned into a plurality of spaced TCO sub-films. In an example, ink can be printed on regions of the TCO film outside the hollow region to form a mask, and then the TCO film in the hollow region can be etched away using an acidic solution such as HCl, followed by removing the ink. In another example, an acidic etching paste can be screen printed on the TCO film to remove the TCO film in the hollow region. It can be understood that the method for forming the hollow region between two adjacent first transparent conductive layers 310 only changes the preparation process and structure of the layer where the first transparent conductive layer 310 is located, without changing the preparation process or structure of other functional layers, such as the first doped layer. The method is simple with relatively low preparation requirements, which is conducive to cost reduction. Moreover, the other layers of a solar cell can be formed through a subsequent cutting step, which is also conducive to improve the cutting accuracy of the other layers.

The region to be cut of the solar cell structure is located between two adjacent first transparent conductive layers 310. The region to be cut can be the region subjected to subsequent laser cutting of the solar cell structure. The region to be cut can have a strip shape extending laterally through the solar cell structure, and thus the solar cell structure can be cut into two solar cells along the region to be cut. Alternatively, the region to be cut can be in a grid shape, and thus the solar cell structure can be cut into three, four, or even more solar cells along the region to be cut. The number of the solar cells cut from the solar cell structure can be decided according to the size of the solar cell structure and the size of the solar cells in need, and is not limited herein.

In some embodiments, between two adjacent first transparent conductive layers 310, the size of the region to be cut is smaller than or equal to the size of the hollow region. For example, the distance between an edge of the region to be cut and a nearest edge of a nearest first transparent conductive layer 310 is greater than 0.5 mm, providing an effective electrical isolation between the first transparent conductive layer 310 and the substrate 110 during the cutting process. Since the region to be cut is located between two adjacent first transparent conductive layers 310, the subsequent laser cutting is applied to the region to be cut within the hollow region, preventing the formation of electrical conducting channels in the p-n region of the solar cells due to laser cutting and effectively reducing cutting-induced efficiency loss. Furthermore, metallization on the integrated solar cell structure compared to on separate solar cells effectively increases the capacity of metallization equipment and reduces the investment cost of GW level production equipment.

In the field of solar cells, laser cutting is commonly used to cut the solar cell structure into a plurality of solar cells. The laser cutting process can generate laser damage zones and mechanical fracture zones on the laser cut edges of the solar cells, varying the original ordered arrangement of silicon atoms in the silicon substrate and forming dangling bonds on the silicon substrate, which significantly reduce the efficiency of the solar cells. A conventional solar cell structure experiences an efficiency loss of about 0.15 to 0.25% after being halved, which also leads to significant power loss in a corresponding photovoltaic module. Particularly, in heterojunction solar cells, both the front and back surfaces are covered with TCO films. After laser cutting, the TCO film debris generated can create electrical conducting channels between the back TCO film and the front TCO film or in the back p-n junction, exacerbating charge carrier recombination at the cut edge, so that the heterojunction solar cells exhibit greater efficiency loss (up to 0.3 to 0.5%) compared to conventional solar cells.

To address the significant efficiency loss caused by the cutting process in preparation of heterojunction cells in related art, the original substrate, e.g., a silicon wafer, is commonly cut into halves firstly, and then the rest processes for preparing the heterojunction cells are performed on the halved substrates to directly form the plurality of solar cells, thus avoiding efficiency loss caused by the laser cutting. However, this method increases the capacity burden on automation equipment for preparing the solar cells, reducing overall effective capacity of production equipment. Particularly for the screen-printing metallization equipment, in order to meet GW level production capacity and compensate the insufficient production capacity, compared to screen-printing on an integrated larger substrate, screen-printing on the halved substrates requires increased equipment configuration, which is not aligned with cost reduction requirement in heterojunction cell industrialization.

In contrast, in the present embodiment, the solar cell structure is a whole piece with the first doped layer 210 and the first transparent conductive layers 310 formed therein before cutting, which can reduce the capacity burden on automation equipment and improve overall effective capacity of production equipment. Additionally, the first transparent conductive layers 310 on the surface of the first doped layer 210 away from the substrate 110 are spaced apart from each other, and the region to be cut is located within the hollow region between two or every adjacent first transparent conductive layers. Since the hollow region is not covered by any first transparent conductive layer, the cutting process will not generate electrical conducting debris, preventing the formation of electrical conducting channels in the p-n region caused by laser cutting, and effectively reducing efficiency loss caused by cutting. Furthermore, metallization on the integrated solar cell structure compared to on separate solar cells effectively increases the production capacity of metallization equipment and reduces the investment cost of GW level production equipment. Therefore, the solar cell structure can reduce the fixed asset investment for producing heterojunction solar cells, reduce the production costs, and reduce the efficiency loss, enhancing the power of final products.

Figure 2:
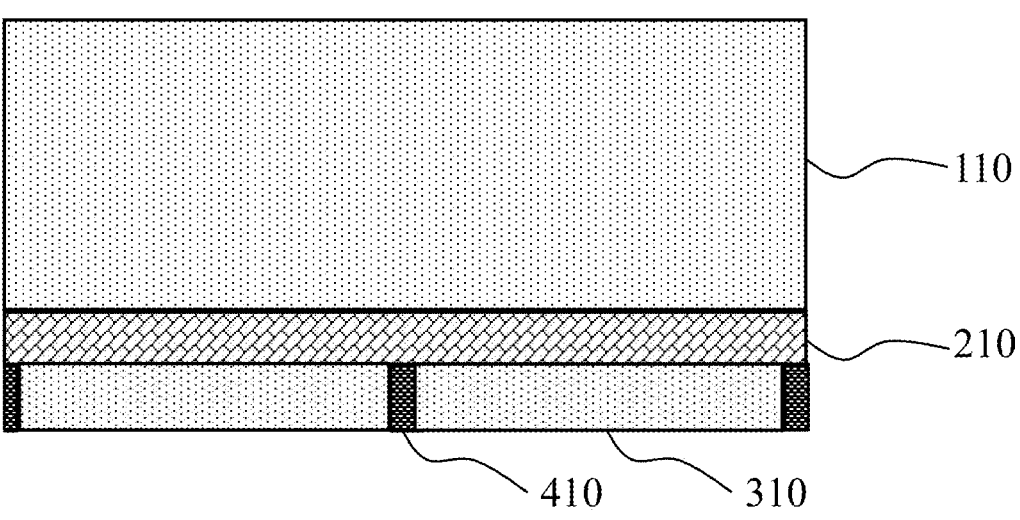
FIG. 2 is a schematic structural view of a solar cell structure in another embodiment.
Figure 16:
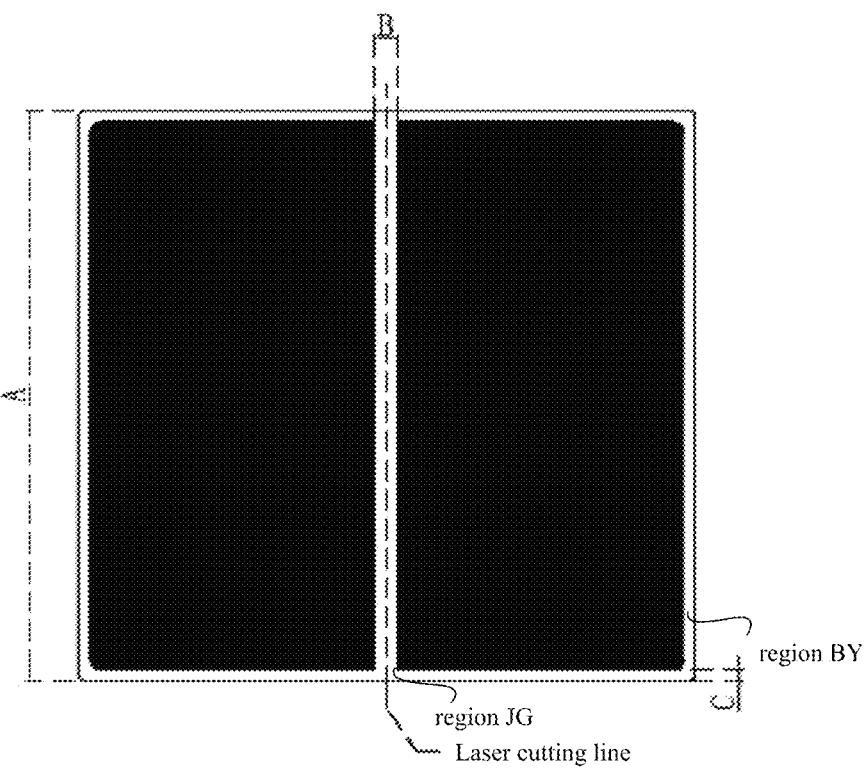
FIG. 16 is a schematic structural view of a mask plate in yet another embodiment.

In an embodiment, referring to FIGS. 2 and 16, the first doped layer 210 includes a gap region (e.g., region JG in FIG. 16) and a margin region (e.g., region BY in FIG. 16). The gap region and the margin region are exposed out from the plurality of first transparent conductive layers 310, and the gap region is located corresponding to the hollow region between the two adjacent first transparent conductive layers 310.

The gap region and the margin region are both regions of the first doped layer 210 not covered by any first transparent conductive layer 310. The gap region is located between two or every adjacent first transparent conductive layers 310, and can prevent the formation of electrical conducting channels in the p-n region caused by laser cutting and effectively reduce efficiency loss. The margin region is located at the periphery of the first doped layer 210, and surrounds the first transparent conductive layers 310 overall, and can isolate and insulate the back surface from the front surface of the solar cells, effectively preventing the formation of electrical conducting channels in the p-n region between the back surface and the front surface. The first doped layer 210 includes regions where the first transparent conductive layers 310 are formed, for collecting electron-hole pairs in the solar cell structure, thereby generating photocurrents. The first doped layer 210 including the above regions can ensure photovoltaic conversion of the solar cell structure, effectively reduce efficiency loss, and effectively prevent the formation of electrical conducting channels in the p-n region Optionally, the width of the gap region between two adjacent first transparent conductive layers 310 can be in a range from 0.5 mm to 2 mm, providing enough space for the region to be cut. The width of the margin region can be in a range from 0.2 mm to 1 mm, effectively preventing the formation of electrical conducting channels between the front surface and the back surface of the solar cells.

Figure 3:
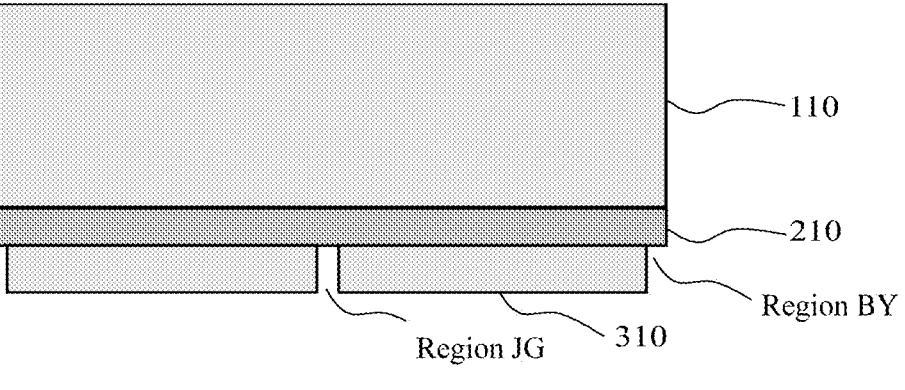
FIG. 3 is a schematic structural view of a solar cell structure in yet another embodiment.

In an embodiment, referring to FIG. 3, the solar cell structure further a first non-conductive antireflection layer 410.

The first non-conductive antireflection layer 410 is disposed on the surface of the first doped layer away from the substrate 110 and located between the two adjacent first transparent conductive layers 310 to space the two adjacent first transparent conductive layers 310 from each other.

The size (e.g., width) of the region to be cut between the two adjacent first transparent conductive layers 310 is smaller than the size (e.g., width) of the first non-conductive antireflection layer 410. The first non-conductive antireflection layer 410 can be a dielectric film with an anti-reflection effect, such as the dielectric film made of SIN, SiON, $SiO_2$, $MgF_2$, etc. Optionally, the first non-conductive antireflection layer 410 can have a single-layer structure or a multi-layer structure. The thickness of the first non-conductive antireflection layer 410 can be in a range from 60 nm to 150 nm.

The first non-conductive antireflection layer 410 is non-conductive, and the region to be cut is narrower than the first non-conductive antireflection layer 410, so that not only the formation of electrical conducting channels in the p-n region caused by laser cutting during the cutting process on the solar cell structure can be prevented, but also the requirement for cutting precision can be reduced, thereby reducing the costs. In addition, the first non-conductive antireflection layer 410 with the anti-reflection effect can enhance the short-circuit current of the solar cells and reduce the reflectance and correspondingly increase incident light, thereby obtaining crystalline silicon solar cells with increased current density and improved efficiency. Thus, on the basis of consideration for electrical and optical properties, both the first transparent conductive layers 310 and the first non-conductive antireflection layer 410 are formed on the surface of the first doped layer 210 away from the substrate 110, which effectively reduces efficiency loss and production cost, thereby improving efficiency of the formed solar cells.

In an embodiment, referring to FIG. 3, the first non-conductive antireflection layer 410 covers the surface of the first doped layer 210 away from the substrate beyond the first transparent conductive layers 310. The surface of the first doped layer 210 beyond the first transparent conductive layers 310 includes the gap region and the margin region as described above. Thus, the coverage of the first non-conductive antireflection layer 410 on the first doped layer 210 is increased, further improving solar cell efficiency.

Figure 4:
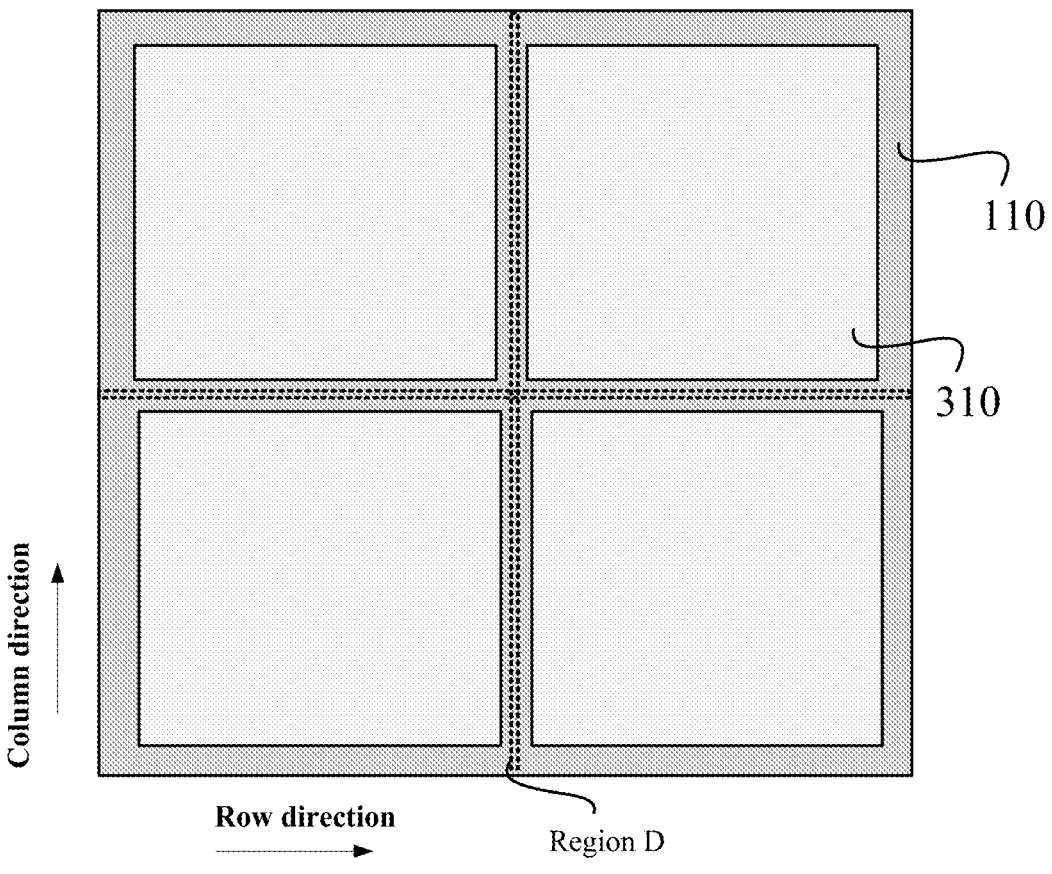
FIG. 4 is a schematic structural view of a solar cell structure in yet another embodiment.

In an embodiment, referring to FIG. 4, the plurality of first transparent conductive layers 310 (e.g., four layers 310 as shown in the figure) are arranged in an array. The region to be cut (e.g., region D in the figure) extends along the row direction and/or the column direction of the array.

The number of the first transparent conductive layers 310 can be two or more, which can be arranged in an array. The gap region can extend along the row direction and/or the column direction of the array. Correspondingly, the region to be cut can extend along the row direction and/or the column direction of the array. As the region to be cut extends along the row direction and/or the column direction of the first transparent conductive layers 310, the cutting difficulty and process complexity can be greatly reduced, leading to an improved yield of production.

Figure 5:
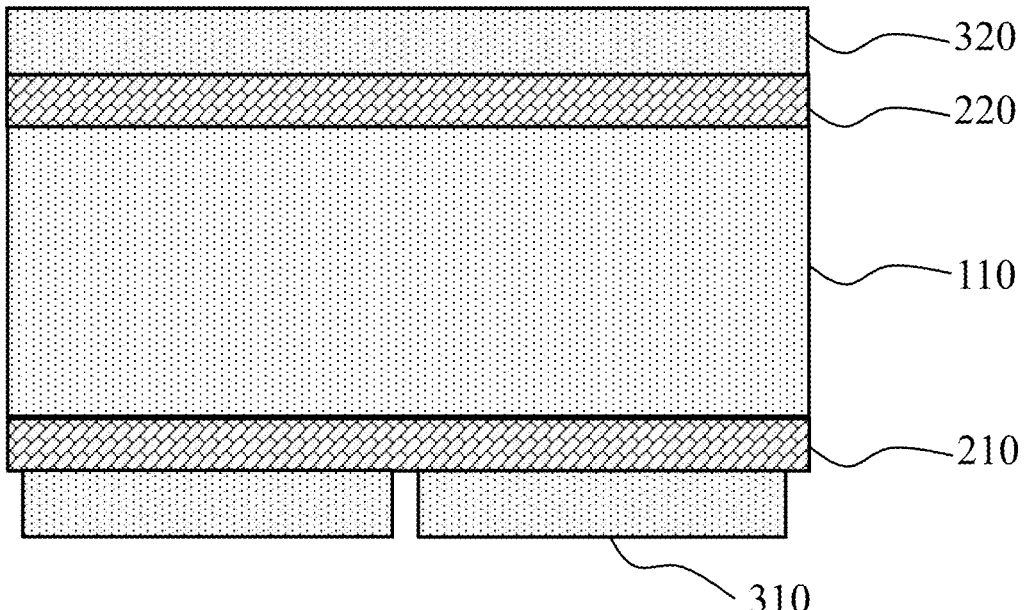
FIG. 5 is a schematic structural view of a solar cell structure in yet another embodiment.

In an embodiment, referring to FIG. 5, the solar cell structure further includes a second doped layer 220 and at least one second transparent conductive layer 320. The second doped layer 220 is disposed on a surface of the substrate 110 away from the first doped layer 210. The at least one second transparent conductive layer 320 is disposed on a surface of the second doped layer 220 away from the substrate 110.

The doping type of the second doped layer 220 is opposite to the doping type of the first doped layer 210. For example, the second doped layer 220 can be n-type doped, while the first doped layer 210 can be p-type doped. The second doped layer 220 is disposed on the surface of the substrate 110 away from the first doped layer 210, e.g., is disposed on the front surface of the substrate 110. The thickness of the second doped layer 220 can be in a range from 5 nm to 20 nm. The second doped layer 220 can be made of doped amorphous silicon or doped microcrystalline silicon, optionally including at least one element of oxygen, carbon, or nitrogen.

The second transparent conductive layer 320 can be a TCO film, the features of which can be referred to the first transparent conductive layer 310 described above, and will not be repeated herein. While the solar cell structure includes a plurality of first transparent conductive layers 310 spaced from each other, the solar cell structure can include only one second transparent conductive layer 320, which is deposited as an integrated layer on the surface of the second doped layer 220 away from the substrate 110. Optionally, the solar cell structure can include a plurality of second transparent conductive layers 320 spaced from each other, thereby forming a hollow region between two or every adjacent second transparent conductive layers 320. The formation of the hollow region can be referred to the embodiments described above, which will not be repeated herein.

Figures 6, 7:
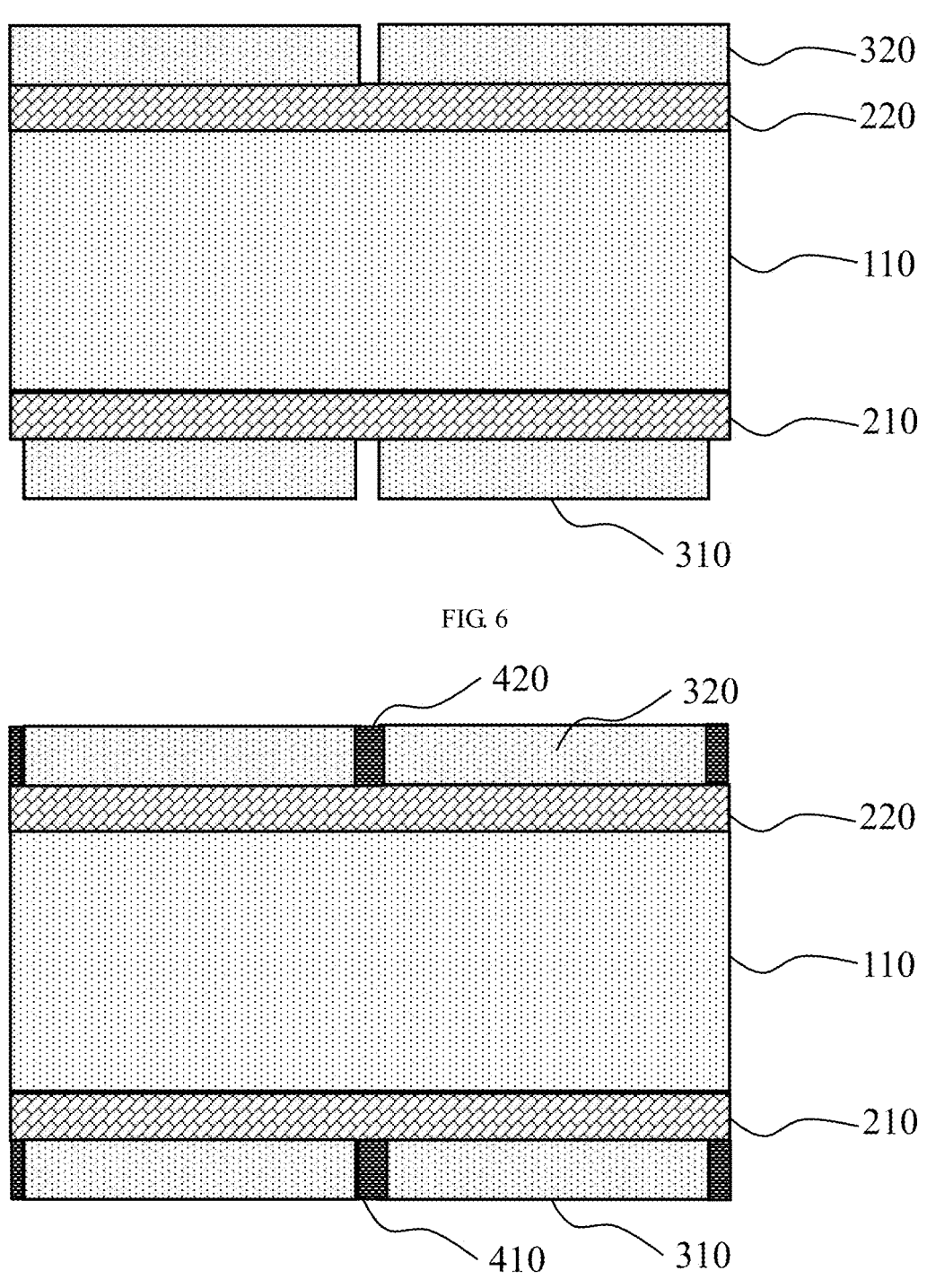
FIG. 6 is a schematic structural view of a solar cell structure in yet another embodiment.
FIG. 7 is a schematic structural view of a solar cell structure in yet another embodiment.

Furthermore, referring to FIG. 6, an orthographic projection of the plurality of second transparent conductive layers 320 on the substrate 110 can be in alignment with an orthographic projection of the plurality of first transparent conductive layers 310 on the substrate 110.

The plurality of second transparent conductive layers 320 are spaced apart from each other and disposed on the surface of the second doped layer 220 away from the substrate 110, forming the hollow region between adjacent second transparent conductive layers 320 for spacing two or every adjacent second transparent conductive layers 320. The plurality of second transparent conductive layers 320 are in one-to-one alignment with the plurality of first transparent conductive layers 310. The hollow region between adjacent second transparent conductive layers 320 is in alignment with the hollow region between adjacent first transparent conductive layers 310, further ensuring that the subsequent laser cutting is applied to the region to be cut in the aligned hollow regions, thereby preventing the formation of electrical conducting channels in the p-n region of the solar cells due to laser cutting and effectively reducing the cutting-induced efficiency loss. Correspondingly, the second doped layer 220 includes a gap region and a margin region. The gap region and the margin region are exposed out from the plurality of second transparent conductive layers 320, and the gap region is located corresponding to the hollow region between the two adjacent second transparent conductive layers 320. Furthermore, the margin region is located at the periphery of the second doped layer 220, and surrounds the second transparent conductive layers 320 overall. The margin region of the second doped layer 220 can be in alignment with the margin region of the first doped layer 210, isolating and insulating the back surface from the front surface of the solar cells, effectively preventing the formation of electrical conducting channels in the p-n region between the back surface and the front surface.

In an embodiment, referring to 7, the solar cell structure further includes a second non-conductive antireflection layer 420.

The second non-conductive antireflection layer 420 is disposed on a surface of the second doped layer 220 away from the substrate 110 and located between two adjacent second transparent conductive layers 320 to space the two adjacent second transparent conductive layers 320 from each other. In an embodiment, the second non-conductive antireflection layer 420 covers the surface of the second doped layer 220 beyond the second transparent conductive layers 320 and away from the substrate, such as the gap region and the margin region of the second doped layer 220 as described above.

The second non-conductive antireflection layer 420 can be a dielectric film with an anti-reflection effect, such as the dielectric film made of SIN, SiON, SiO$_2$, MgF$_2$, etc. Optionally, the second non-conductive antireflection layer 420 can have a single-layer structure or a multi-layer structure. The thickness of the second non-conductive antireflection layer 420 can be in a range from 60 nm to 150 nm.

Between the two adjacent second transparent conductive layers 320, the region to be cut is narrower than the second non-conductive antireflection layer 420. While the plurality of second transparent conductive layers 320 are in alignment with the plurality of first transparent conductive layers 310, the second non-conductive antireflection layer 420 can be in alignment with at least part of the first non-conductive antireflection layer 410 located on the gap region, and the region to be cut can be a region perpendicularly extending through the substrate 110 from the front surface to the back surface. As such, a double antireflection effect on the gap regions can be achieved. Furthermore, the second non-conductive antireflection layer 420 can be further in alignment with the first non-conductive antireflection layer 410 on the margin region, achieving a double antireflection effect on the margin region. Therefore, on the basis of consideration for electrical and optical properties, by forming the first transparent conductive layer 310 and the first non-conductive antireflection layer 410 on the surface of the first doped layer 210 away from the substrate 110, and forming the second transparent conductive layer 320 and the second non-conductive antireflection layer 420 on the surface of the second doped layer 220 away from the substrate 110, efficiency loss and production cost can be effectively reduced, and efficiency of the formed solar cells can be improved.

In an embodiment, referring to FIG. 8, the solar cell structure further includes a second passivation layer 520 and at least one second electrode 620. The second passivation layer 520 is disposed between the second doped layer 220 and the substrate 110. The at least one second electrode 620 is disposed on a side of the at least one second transparent conductive layer 320 away from the second doped layer 220.

The second passivation layer 520 and the second electrode 620 can be formed on the front side of the substrate 110. The second passivation layer 520, the second electrode 620, the second doped layer 220, the second transparent conductive layer 320, and the second non-conductive antireflection layer 420 together form a front structure The second passivation layer 520 can include an intrinsic amorphous silicon layer, a silicon oxide passivation layer, or a combination thereof, to achieve front passivation effect. Optionally, the thickness of the second passivation layer 520 can be in a range from 2 nm to 10 nm. The second electrode 620 can be a metal electrode formed by screen printing, laser transfer, or electroplating. Specifically, the second electrode 620 can be formed by screen printing or laser transfer with low-temperature silver paste, low-temperature copper paste, or silver-coated copper paste, or can be formed by electroplating metal or alloy selected from Al, Ti, Ni, Co, Ag, Cu, Sn, and any combination thereof, forming a patterned electrode. In the present embodiment, the second electrode 620 can be a metal line, and the width and thickness of the metal line are not limited herein. The solar cell structure can include a plurality of second electrodes 620, allowing the solar cells formed by cutting each can include a corresponding second electrode 620.

In an embodiment, referring to FIG. 8, the solar cell structure further includes a first passivation layer 510 and a plurality of first electrodes 610.

The first passivation layer 510 is disposed between the first doped layer 210 and the substrate 110. The first electrodes 610 are disposed on a side of the first transparent conductive layers 310 away from the first doped layer 210. At least one first electrode 310 is disposed on each of the first transparent conductive layers 310 away from the first doped layer 210.

The first passivation layer 510 and the first electrodes 610 can be formed on the back side of the substrate 110. The first passivation layer 510, the first electrodes 610, the first doped layer 210, the first transparent conductive layers 310, and the first non-conductive antireflection layer 410 together form a back structure.

The first passivation layer 510 can include an intrinsic amorphous silicon layer, a silicon oxide passivation layer, or a combination thereof, to achieve back passivation effect. Optionally, the thickness of the first passivation layer 510 can be in a range from 2 nm to 10 nm. The first electrodes 610 can be metal electrodes formed by screen printing, laser transfer, or electroplating. Specifically, the first electrodes 610 can be formed by screen printing or laser transfer with low-temperature silver paste, low-temperature copper paste, or silver-coated copper paste, or can be formed by electroplating metals or alloys selected from Al, Ti, Ni, Co, Ag, Cu, Sn, and any combination thereof, forming patterned electrodes. In the present embodiment, the first electrodes 610 can be metal lines, and the width and thickness of the metal lines are not limited herein. At least one first electrode 310 is formed on each of the first transparent conductive layers 310 away from the first doped layer 210, allowing the solar cells formed by cutting can each include a corresponding first electrode 610, thereby forming complete solar cells.

An embodiment of the present application provides a method for preparing a solar cell, which can be any one of the solar cells in the above embodiments. The structure, function, and operation principle of the solar cell have been described in the above embodiments and will not be repeated herein. In an embodiment, referring to FIG. 9, the method for preparing a solar cell includes steps S902 to S906.

In step S902, a substrate is provided, and a first doped layer is formed on a surface of the substrate.

In step S904, a plurality of first transparent conductive layers spaced apart from each other are formed on a surface of the first doped layer away from the substrate.

In step S906, the solar cell structure is cut along a region to be cut. The region to be cut is located between two adjacent first transparent conductive layers.

In the present embodiment, the substrate can undergo processes such as cleaning, polishing, and texturing before forming the first doped layer. A required conductive doped material can be deposited on the surface of the substrate using very high frequency plasma enhanced chemical vapor deposition (VHF-PECVD) equipment to form the first doped layer. Then, a required transparent conductive material can be deposited on the surface of the first doped layer using physical vapor deposition (PVD) equipment to form the first transparent conductive layers spaced from each other. The hollow region between adjacent first transparent conductive layers can be formed by the method as described in the above embodiments. Optionally, the deposition temperature of the first doped layer can be in a range from 160°

C. to 210° C., and the deposition temperature of the first transparent conductive layers can be in a range from 0° C. to 200° C.

In the present embodiment, laser with predetermined parameters can be used to cut the solar cell structure along the region to be cut into two or more solar cells. The cutting can be performed from the back surface, which receives laser irradiation. The predetermined parameters of laser involve power, scanning speed, spot size, cutting temperature, etc.

In the present embodiment, the method for preparing the solar cell includes providing a substrate, and forming a first doped layer on a surface of the substrate; forming a plurality of first transparent conductive layers spaced apart from each other on a surface of the first doped layer away from the substrate, thereby achieving an integrated solar cell structure; and cutting the solar cell structure along a region to be cut. Since the region to be cut is located between two adjacent first transparent conductive layers, which is not covered by any first transparent conductive layer, the cutting process will not generate electrical conducting debris, preventing the formation of electrical conducting channels in the p-n region caused by laser cutting, effectively reducing cutting-induced efficiency loss. Furthermore, metallization on the integrated solar cell structure compared to on separate solar cells effectively increases the production capacity of metallization equipment and reduces the investment cost of GW level production equipment. Therefore, the solar cell structure can reduce the fixed asset investment for producing heterojunction solar cells, reduce the production costs, and reduce the efficiency loss, enhancing the power of final products.

In an embodiment, referring to FIG. 10, forming the plurality of first transparent conductive layers spaced apart from each other on the surface of the first doped layer away from the substrate includes steps S102 to S104.

In step S102, a transparent conductive material layer is formed on the surface of the first doped layer away from the substrate.

In step S104, the transparent conductive material layer is patterned into the plurality of first transparent conductive layers.

In the present embodiment, a required transparent conductive material can be deposited on the surface of the first doped layer through PVD to form the transparent conductive material layer, which can be then patterned to form the plurality of first transparent conductive layers. In an example, ink can be printed on regions of the TCO film outside the hollow region to form a mask, and then the TCO film in the hollow region can be etched away using an acidic solution such as HCl, followed by removing the ink. In another example, an acidic etching paste can be screen printed on the TCO film to remove the TCO film in the hollow region.

In an embodiment, forming the plurality of first transparent conductive layers spaced apart from each other on the surface of the first doped layer away from the substrate includes: forming the plurality of first transparent conductive layers on the surface of the first doped layer away from the substrate by using a mask plate.

In the present embodiment, the mask plate can block a gap region from being deposited with the transparent conductive material. The width of the gap region is larger than or equal to that of the region to be cut. The mask plate can include a blocking strip, which is configured for blocking the gap region of the first doped layer, thereby exposing the gap region of the first doped layer out between two adjacent first transparent conductive layers after forming the plurality of first transparent conductive layers. The method for forming the gap region can be referred to the relevant description above, which will not be repeated herein.

Optionally, the substrate with the first doped layer can be placed on one side of the mask plate, and the first doped layer is placed adjacent to the mask plate. A deposition source can be disposed on the side of the mask plate away from the substrate. For example, the mask plate can be positioned below the substrate, and the deposition source can be positioned below the mask plate, so as to deposit the first transparent conductive layers on the lower surface of the first doped layer away from the substrate. As such, the plurality of first transparent conductive layers can be formed on the surface of the first doped layer away from the substrate by using the mask plate;

Optionally, the mask plate can further include a first frame, which is configured for blocking a margin region of the first doped layer, thereby exposing the margin region of the first doped layer out after forming the plurality of first transparent conductive layers. The method for forming the margin region can be referred to the relevant description above, which will not be repeated herein.

In an embodiment, the method for preparing the solar cell further includes: forming a first non-conductive antireflection layer on a surface of the first doped layer away from the substrate. The first non-conductive antireflection layer is located between the two adjacent first transparent conductive layers to space the two adjacent first transparent conductive layers. The size of the region to be cut between the two adjacent first transparent conductive layers is smaller than the size of the first non-conductive antireflection layer.

In the preset embodiment, a required dielectric material can be deposited on the gap region using low-temperature PECVD equipment at a deposition temperature less than or equal to 200° C. or using sputtering equipment to form the first non-conductive antireflection layer.

In an embodiment, the first non-conductive antireflection layer covers the surface of the first doped layer beyond the first transparent conductive layers and away from the substrate, which increases the coverage of the first non-conductive antireflection layer on the first doped layer to further improve the solar cell efficiency. Additionally, the required dielectric material can be deposited on the gap region and the margin region using another mask plate to form the first non-conductive antireflection layer covering the surface of the first doped layer beyond the first transparent conductive layers and away from the substrate.

In an embodiment, the plurality of first transparent conductive layers are formed in an array, and cutting the solar cell structure along the region to be cut includes: cutting the solar cell structure along a row direction and/or a column direction of the array, thereby forming a plurality of solar cells. As the region to be cut extends along the row direction and/or the column direction of the first transparent conductive layers, the cutting difficulty and process complexity can be greatly reduced, thus improving a yield of production.

In an embodiment, referring to FIG. 11, the method for preparing a solar cell further includes steps S112 to S114.

In step S112, a second doped layer is formed on a surface of the substrate away from the first doped layer. The doping type of the second doped layer is opposite to the doping type of the first doped layer.

In step S114, at least one second transparent conductive layer is formed on a surface of the second doped layer away from the substrate.

In the present embodiment, a required conductive doped material can be deposited on the surface of the substrate using VHF-PECVD equipment to form the second doped layer. Then, a required transparent conductive material can be deposited on the surface of the second doped layer using PVD equipment to form the second transparent conductive layer. Optionally, the deposition temperature of the second doped layer can be in a range from 160° C. to 210° C., and the deposition temperature of the second transparent conductive layers can be in a range from 0° C. to 200° C.

Optionally, a plurality of spaced second transparent conductive layers can be formed on the surface of the second doped layer away from the substrate. The plurality of second transparent conductive layers are in one-to-one alignment with the plurality of first transparent conductive layers. The hollow region between two adjacent second transparent conductive layers is in alignment with the hollow region between two adjacent first transparent conductive layers, further ensuring that the subsequent laser cutting is applied to the regions to be cut in the aligned hollow regions, thereby preventing the formation of electrical conducting channels in the p-n region of the solar cells due to laser cutting and effectively reducing the cutting-induced efficiency loss. Optionally, the margin region of the second doped layer can be exposed out from periphery of the second transparent conductive layers. The margin region of the second doped layer can be in alignment with the margin region of the first doped layer, isolating and insulating the back surface from the front surface of the solar cells, effectively preventing the formation of electrical conducting channels in the p-n region between the back surface and the front surface.

In an embodiment, the method for preparing the solar cell further includes:

forming a second non-conductive antireflection layer on a surface of the second doped layer away from the substrate, The second non-conductive antireflection layer is located between two adjacent second transparent conductive layers to space the two adjacent second transparent conductive layers from each other.

The size of the region to be cut between the two adjacent second transparent conductive layers is smaller than the size of the second non-conductive antireflection layer between the two adjacent second transparent conductive layers.

In the preset embodiment, a required dielectric material can be deposited on the gap region using low-temperature PECVD equipment at a deposition temperature less than or equal to 200° C. or using sputtering equipment to form the second non-conductive antireflection layer.

In an embodiment, the second non-conductive antireflection layer covers the surface of the second doped layer beyond the second transparent conductive layers and away from the substrate, which increases the coverage of the second non-conductive antireflection layer on the second doped layer to further improve the solar cell efficiency. Additionally, the required dielectric material can be deposited on the gap region and the margin region using another mask plate to form the second non-conductive antireflection layer covering the surface of the second doped layer beyond the first transparent conductive layers and away from the substrate.

In an embodiment, referring to FIG. 12, the method for preparing the solar cell further includes steps S122 to S124.

In step S122, a second passivation layer is formed between the second doped layer and the substrate.

In step S124, a second electrode is formed on a side of the second transparent conductive layer away from the second doped layer.

In the present embodiment, the second passivation layer can be formed by using a radio frequency plasma enhanced chemical vapor deposition (RF-PECVD) system. For example, an intrinsic amorphous silicon layer as the second passivation layer can be deposited by using RF-PECVD. The second electrode can be a metal electrode formed by screen printing, laser transfer, or electroplating. Specifically, the second electrode can be formed by screen printing or laser transfer with low-temperature silver paste, low-temperature copper paste, or silver-coated copper paste, or can be formed by electroplating metal or alloy selected from Al, Ti, Ni, Co, Ag, Cu, Sn, and any combination thereof, forming a patterned electrode.

In an embodiment, referring to FIG. 13, the method for preparing the solar cell further includes steps S132 to S134.

In step S132, a first passivation layer is formed between the first doped layer and the substrate.

In step S134, first electrodes are formed on a side of the first transparent conductive layers away from the first doped layer. At least one first electrode is formed on a side of each of the first transparent conductive layers away from the first doped layer.

In the present embodiment, the first passivation layer can be formed by using RF-PECVD. For example, an intrinsic amorphous silicon layer as the first passivation layer can be deposited by using RF-PECVD. The first electrodes can be metal electrodes formed by screen printing, laser transfer, or electroplating. Specifically, the first electrodes can be formed by screen printing or laser transfer with low-temperature silver paste, low-temperature copper paste, or silver-coated copper paste, or can be formed by electroplating metals or alloys selected from Al, Ti, Ni, Co, Ag, Cu, Sn, and any combination thereof, forming patterned electrodes.

The method for preparing the solar cell is described in a specific optional embodiment as follows.

Step 1: An n-type monocrystalline silicon wafer with a thickness of 60 μm to 180 μm and an electrical resistivity of 0.2 Ω·cm to 30 Ω·cm is provided. The silicon wafer is cleaned by using a high-temperature furnace or a chain-type cleaning device to improve the quality of the silicon wafer. The sheet resistance of the cleaned silicon wafer is 20 Ω/m to 40 Ω/m.

Step 2: The phosphosilicate glass (PSG) layer on the surface of the silicon wafer is removed by a wet method using an acidic solution such as a solution of HF, $HNO_3$, or HCL. Then the silicon wafer is polished and textured using an alkaline solution such as a solution of KOH, NaOH, or tetramethylammonium hydroxide (TMAH), including an additive such as isopropanol (IPA), to form a surface with pyramid-shaped texture.

Step 3: A first passivation layer 510 and a second passivation layer 520 are respectively deposited on the opposite surfaces of the n-type silicon wafer using RF-PECVD. The process gas includes one or more of $SiH_4$, $H_2$, $CO_2$, $CH_4$, or $N_2O$. The thickness of each of the first and second passivation layers 510, 520 is in a range from 2 nm to 10 nm. The deposition temperature is in a range from 160° C. to 210° C. The deposition pressure is in a range from 0.2 mbar to 2 mbar.

Step 4: A first doped layer 210 is deposited on the first passivation layer 510 using VHF-PECVD. The process gas includes one or more of $SiH_4$, $H_2$, $CO_2$, $CH_4$, $N_2O$, or $PH_3$. The thickness of the first doped layer 210 is in a range from 5 nm to 20 nm. The deposition temperature is in a range from 160° C. to 210° C. The deposition pressure is in a range from 0.5 mbar to 5 mbar.

Step 5: A second doped layer 220 is deposited on the second passivation layer 520 using VHF-PECVD. The process gas includes one or more of $SiH_4$, $H_2$, $CO_2$, $CH_4$, $N_2O$, $B_2H_6$, or trimethylborane (TMB). The thickness of the second doped layer 220 is in a range from 5 nm to 30 nm. The deposition temperature is in a range from 160° C. to 210° C. The deposition pressure is in a range from 0.5 mbar to 5 mbar.

Step 6: A plurality of spaced first transparent conductive layers 310 and a plurality of spaced second transparent conductive layers 320 are deposited using PVD. The deposition temperature is in a range from 0° C. to 200° C., the power is in a range from 3 kW to 8 kW, and the chamber pressure is in a range from 0.3 Pa to 1.0 Pa. The process gas includes one or more of Ar, $O_2$, $H_2$, Ar and $O_2$, Ar and $H_2$, or $H_2O$.

Step 7: Metal electrodes are formed on the first and second transparent conductive layers 310, 320.

Step 8: The formed solar cell structure is cut into final HJT solar cells with laser. The cutting can be performed from the back surface, which receives laser irradiation. The power of a laser is in a range from 10 W to 150 W, the scanning speed the laser is in a range from 1000 mm/s to 8000 mm/s, the spot size of the laser is in a range from 10 μm to 300 μm, and the temperature of the laser is lower than 200° C. The cutting direction is parallel to the extending direction of the electrodes.

It should be understood that, besides the above-described steps involved in the method for preparing the solar cell, other conventional steps can be included to obtain corresponding effects according to actual needs, and will not be limited herein.

It should be understood that though the steps in the flow charts involved in the above embodiments are shown sequentially as indicated by the arrows, these steps are not necessarily executed sequentially in the order indicated by the arrows. Unless otherwise specified herein, the sequence of the steps is not strictly limited, and the steps may be performed in other orders. Moreover, at least some of the steps in the flow charts involved in the above embodiments can include multiple sub-steps or multiple stages, these sub-steps or stages are not necessarily performed at the same time, but may be performed at different times. These sub-steps or stages are not necessarily to be sequentially performed, but can be performed alternately or in turn with at least some of the sub-steps or stages of other steps.

An embodiment of the present application also provides a mask plate employed in combination with the preparation method described above to prepare the solar cell in any one of the above-described embodiments. The structure, function, working principle, and preparation method of the solar cell have been described in the above embodiments and will not be repeated herein. In an embodiment, referring to FIG. 14, the mask plate includes a blocking strip 710 and a first frame 720.

The first frame 720 is configured to mask a margin region of a first doped layer of a solar cell structure during forming a plurality of first transparent conductive layers on the first doped layer, thereby exposing the margin region of the first doped layer out from the plurality of first transparent conductive layers. The blocking strip 710 is configured to mask a gap region of the first doped layer located corresponding to space between two adjacent first transparent conductive layers during forming of the plurality of first transparent conductive layers, thereby exposing the gap region of the first doped layer out from the plurality of first transparent conductive layers. A region to be cut of the solar cell structure is located in the gap region.

Figures 14, 15:
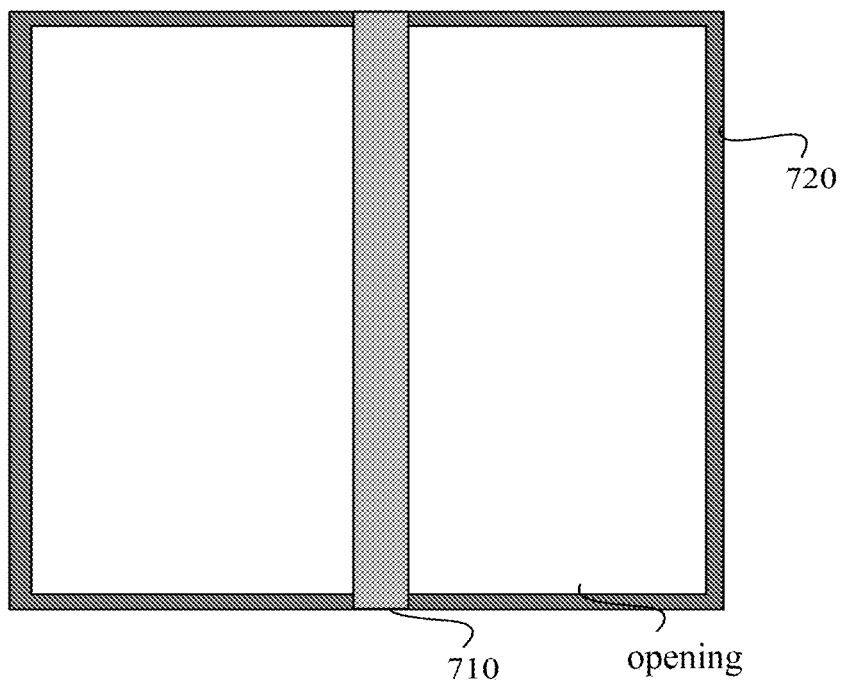
FIG. 14 is a schematic structural view of a mask plate in an embodiment.
FIG. 15 is a schematic structural view of a mask plate in yet another embodiment.

The first frame 720 can be an inner frame of the mask plate. The mask plate can include at least two openings surrounded and defined by the first frame 720 and the blocking strip 710. The openings allow materials sputtered or evaporated from the deposition source to travel through and be deposited onto the surface of the first doped layer, forming at least two first transparent conductive layers. The first frame 720 and the blocking strip 710 block the materials of the deposition source, forming a masking region, which includes the gap region between two adjacent first transparent conductive layers and the margin region surrounding the plurality of first transparent conductive layers. The gap region and the margin region have been described in the above embodiments and will not be repeated herein. In an embodiment, in order to form more than two first transparent conductive layers, the mask plate includes two or more blocking strips 710. The plurality of blocking strips 710 can be evenly or unevenly distributed according to actual needs. Referring to FIG. 15, in an embodiment, in order to form an array of first transparent conductive layers distributed in row and column directions, the plurality of blocking strips 710 can be divided into two groups. The blocking strips 710 belonged to one group are crossed with the blocking strips 710 belonged to the other group. Thus, openings aligned in an array can be formed between the blocking strips 710, or between the blocking strips 710 and the first frame 720. The number of openings in the row and column directions of the mask plate is not limited and can be set according to actual needs.

In an embodiment, the mask plate includes only one blocking strip 710, and two openings are formed by the blocking strip 710 and the first frame 720, which can form two first transparent conductive layers. Referring to FIG. 16, the margin region can be formed due to the blocking of the first frame 720 in the deposition process, isolating and insulating the back surface from the front surface of the solar cell. A hollow region can be formed due to the blocking of the blocking strip 710. In FIG. 16, A represents the length of the solar cell structure, B represents the width of the hollow region formed by the blocking of the blocking strip 710, and C represents the width of the margin region formed by the blocking of the first frame 720, where 2 mm≥B≥0.5 mm, and 1 mm≥C≥0.2 mm.

Optionally, the material of the blocking strip 710 can include metal having sufficient toughness and heat resistance (without obvious deformation under 200° C.), such as tungsten, titanium, or iron. The surface of the metal can be coated with a heat-resistance insulating film, such as aluminum oxide ceramic film, yttrium oxide ceramic film, zirconium oxide ceramic film, etc. Alternatively, the blocking strip 710 is made of a heat-resistance insulating and protecting ceramic material. It can be understood that the material of the blocking strip 710 can further include other materials, such as stainless steel, carbon fibers, aluminum, titanium alloy, graphite, or other alloys and hard materials, such as composites of stainless steel and carbon fibers.

In the present embodiment, the mask plate can block regions of the first doped layer located on the surface of the substrate during the formation of the first transparent conductive layers, exposing the gap region and the margin region out from the first transparent conductive layers, the gap region is located between two adjacent first transparent conductive layers. The region to be cut is located in the gap region. Since the region to be cut is located between two adjacent first transparent conductive layers, which is not covered by any first transparent conductive layer, the cutting process will not generate electrical conducting debris, preventing the formation of electrical conducting channels in the p-n region caused by laser cutting, effectively reducing cutting-induced efficiency loss. The margin region is located at the periphery of the first doped layer, and surrounds the first transparent conductive layers overall, and therefore can isolate and insulate the back surface from the front surface of the solar cells, effectively preventing the formation of electrical conducting channels in the p-n region between the back surface and the front surface. Furthermore, metallization on the integrated solar cell structure compared to on separate solar cells effectively increases the production capacity of metallization equipment and reduces the investment cost of GW level production equipment. Therefore, employing the mask plate in preparation of the solar cell can reduce the fixed asset investment for producing heterojunction solar cells, reduce the production costs, and reduce the efficiency loss, enhancing the power of final products.

Figure 19:
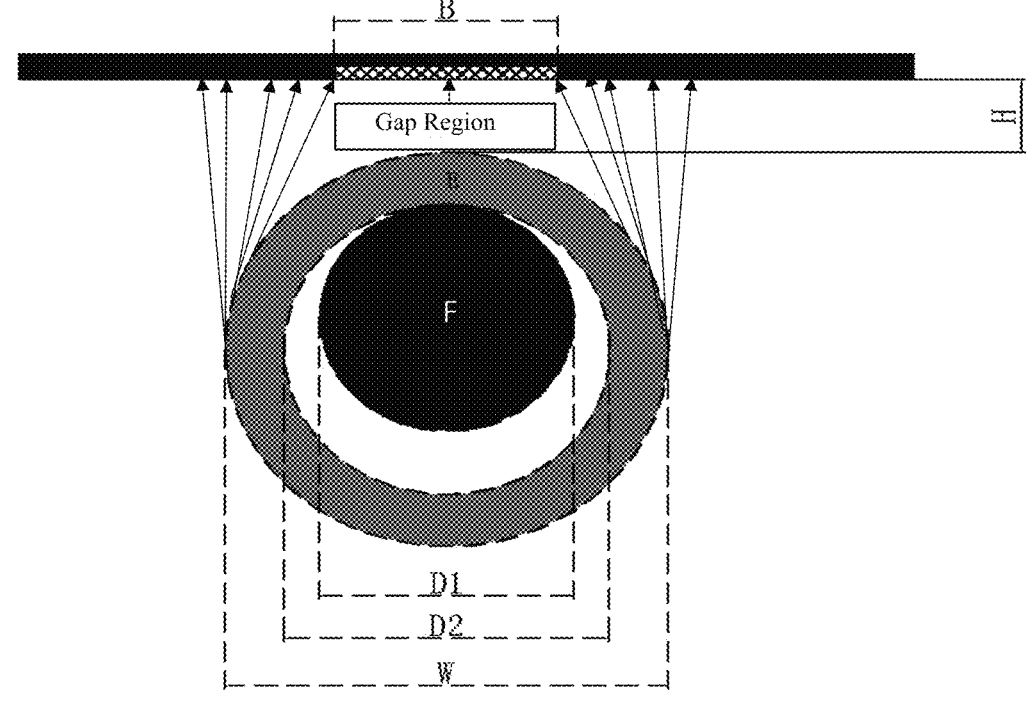
FIG. 19 is a schematic view of forming a gap region in an embodiment.

In an embodiment, the blocking strip 710 extends from one edge of the frame to an opposite edge of the frame, the width of the blocking strip 710 is greater than the width of the gap region, and the width direction is perpendicular to the extending direction of the blocking strip 710. As blocking strip 710 is not in contact with but distanced from the first doped layer, and thus, the blocking region formed on the first doped layer by the blocking strip 710 is narrower than the blocking strip 710. Referring to FIG. 19, the maximum width W of the blocking strip 710 and the distance H between the blocking strip 710 and the first doped layer collectively determine the width B of the gap region formed in the deposition process. Therefore, the width of the blocking strip 710 can be set according to actual needs.

Figure 17:
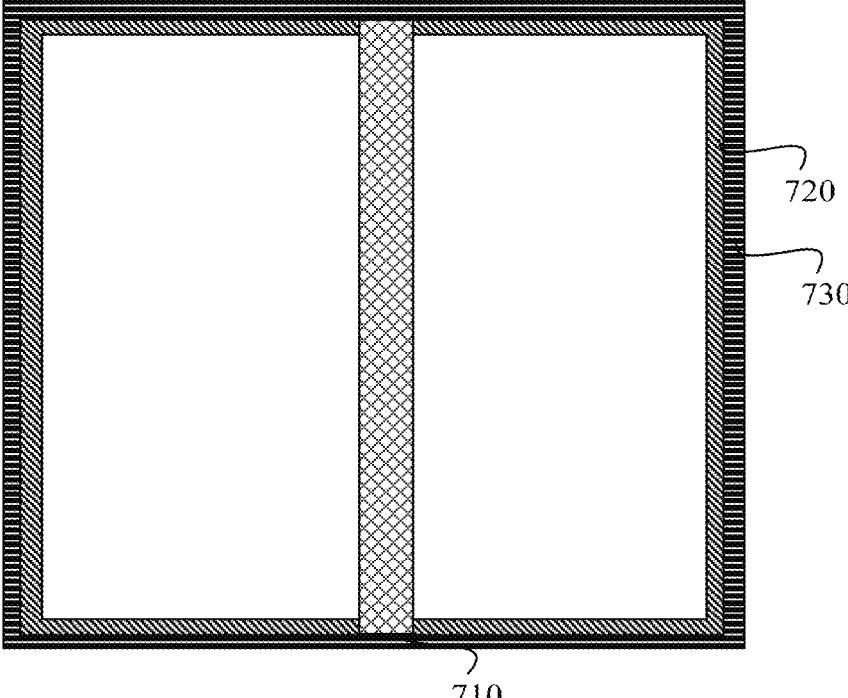
FIG. 17 is a schematic structural view of a mask plate in yet another embodiment.

In an embodiment, referring to FIG. 17, the mask plate further includes a second frame 730 enveloping the first frame 720, and opposite edges of the second frame 730 includes openings or slots, through which the blocking strip 710 is fixed to the second frame 730.

The second frame 730 can be the outer frame of the mask plate, surrounding the first frame 720. The blocking strip 710 is fixed to the second frame 730 through openings or slots on opposite edges of the second frame 730. For example, the blocking strip 710 can be fixed by extending through openings on the second frame 730, or by being embedded in the slots on the second frame 730.

Figures 18A, 18B, 18C:
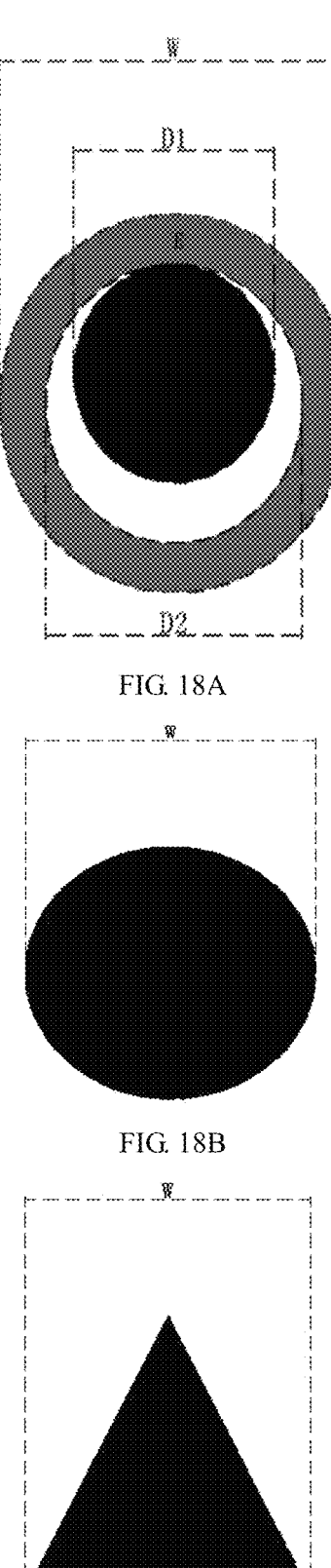
FIG. 18A is a schematic structural view of a blocking strip in an embodiment.
FIG. 18B is a schematic structural view of a blocking strip in another embodiment.
FIG. 18C is a schematic structural view of a blocking strip in yet another embodiment.
Figure 18D:
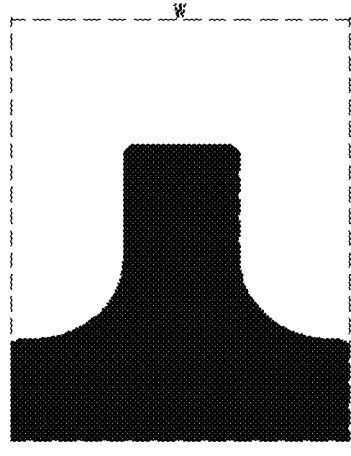
FIG. 18D is a schematic structural view of a blocking strip in yet another embodiment.
Figure 18E:
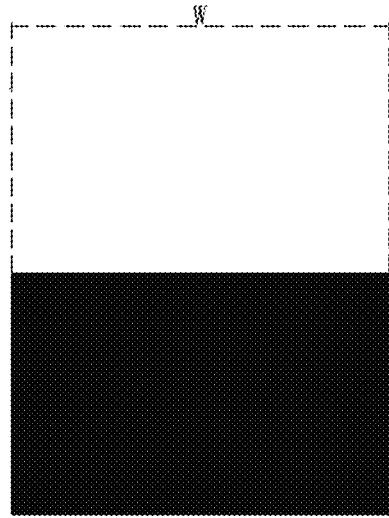
FIG. 18E is a schematic structural view of a blocking strip in yet another embodiment.

Optionally, referring to FIGS. 18A to 18E, the cross-sectional shape of the blocking strip 710 can be but not limited to a circle, a ring a triangle, a rectangular, a T-shape, etc. The regular cylindrical blocking strips 710 as shown in FIGS. 18A and 18B are more suitable for extending through openings, while the blocking strips 710 with angular edges as shown in FIGS. 18C and 18D are more suitable for being embedded in the slots. The rectangular blocking strip 710 shown in FIG. 18E is suitable for both ways.

Furthermore, referring to FIG. 19, taking the structure and shape of the blocking strip 710 in FIG. 18A as an example, where a tungsten wire at the center is surrounded by a ceramic tube, D1 denotes the diameter of the tungsten wire, D2 denotes the inner diameter of the ceramic tube, W denotes the outer diameter of the ceramic tube, H denotes the distance between the highest point of the blocking strip 710 and the lower surface of the first doped layer, and B denotes the width of the hollow region blocked by the blocking strip 710. The shape and maximum width W of the blocking strip 710, together with the distance H between the blocking strip 710 and the lower surface of the first doped layer, collectively determine the width B of the hollow region during the deposition process. Therefore, W>B, and H can be in a range from 0.1 mm to 2 mm; W can be in a range from 1 mm to 3 mm; D1 can be in a range from 0.5 mm to 2 mm; D1<D2<W.

It can be understood that the mask plate of the present embodiment is not limited to be used in the formation of the first transparent conductive layers, but can also be applied in the formation of the second transparent conductive layer, the specific process of which can be referred but not limited to the formation of the first transparent conductive layer. Additionally, the mask plate of the present embodiment can also be applied in the formation of other functional layers or other products, which is not further limited herein.

An embodiment of the present application further provides a photovoltaic module. The photovoltaic module includes a cell group including solar cells connected together. The solar cells are cut from the solar cell structure provided by any one of the above embodiments, or prepared by the method for preparing the solar cell provided by any one of the above embodiments.

The photovoltaic module can further include an encapsulation layer and a cover plate. The encapsulation layer is configured to cover the surface of the cell group. The cover plate is configured to cover the surface of the encapsulation layer away from the cell group. The solar cells are electrically connected to form a whole piece or multiple pieces, thus forming a plurality of cell groups. The plurality of cell groups are electrically connected in series and/or in parallel. Specifically, in some embodiments, the plurality of cell groups can be electrically connected through conductive strips. The encapsulation layer covers the surface of the solar cells. Exemplarily, the encapsulation layer can be an organic encapsulation film, such as an ethylene-vinyl acetate copolymer film, a polyethylene-octene elastomer film, or a polyethylene terephthalate film. The cover plate can be a glass cover plate, a plastic cover plate, or the like, which has a light-transmitting function.

An embodiment of the present application further provides a photovoltaic system, including the photovoltaic module provided in any one of the above embodiments. The photovoltaic system can be applied to photovoltaic power stations, such as ground power stations, roof power stations, water surface power stations, etc. Alternatively, the photovoltaic system can be applied to equipment or devices that use solar energy to generate electricity, such as user solar power supplies, solar street lights, solar cars, solar buildings, etc. It can be understood that the application scenarios of the photovoltaic system are not limited to the above, that is, the photovoltaic system can be applied in all fields in which solar energy is needed to generate electricity. Taking a photovoltaic power generation network as an example, the photovoltaic system can include photovoltaic arrays, a combiner box, and an inverter. The photovoltaic array can be an array of multiple photovoltaic modules. For example, the multiple photovoltaic modules can form multiple photovoltaic arrays. The photovoltaic arrays are connected to the combiner box, which can combine the currents generated by the photovoltaic arrays. The combined current flows through the inverter and is converted into the alternating current suitable for the power grid, and then connected to the power grid to realize solar power supply.

The technical features of the above embodiments can be combined arbitrarily. In order to make the description concise, not all possible combinations of the technical features are described in the embodiments. However, as long as there is no contradiction in the combination of these technical features, the combinations should be considered as in the scope of the present application.

The above-described embodiments are only several implementations of the present application, and the descriptions are relatively specific and detailed, but they should not be construed as limiting the scope of the present application. It should be understood by those of ordinary skill in the art that various modifications and improvements can be made without departing from the concept of the present application, and all fall within the protection scope of the present application. Therefore, the patent protection of the present application shall be defined by the appended claims.

What is claimed is:

1. A method for preparing a solar cell, comprising:
   providing a substrate, and forming a first doped layer on a surface of the substrate;
   forming a plurality of first transparent conductive layers spaced apart from each other on a surface of the first doped layer away from the substrate;
   forming a first non-conductive antireflection layer on the surface of the first doped layer away from the substrate, the first non-conductive antireflection layer being located between two adjacent first transparent conductive layers to space the two adjacent first transparent conductive layers, thereby achieving a solar cell structure; and
   cutting the solar cell structure along a region to be cut, wherein the region to be cut is located between the two adjacent first transparent conductive layers;
   wherein a size of the region to be cut between the two adjacent first transparent conductive layers is smaller than a size of the first non-conductive antireflection layer.

2. The method according to claim 1, wherein forming the plurality of first transparent conductive layers spaced apart from each other on the surface of the first doped layer away from the substrate comprises:
   forming the plurality of first transparent conductive layers on the surface of the first doped layer away from the substrate by using a mask plate;
   wherein the mask plate comprises a blocking strip, the blocking strip is configured to abut against the first doped layer to mask a gap region of the first doped layer located corresponding to a space between the two adjacent first transparent conductive layers, thereb exposing the gap region of the first doped layer out from the plurality of first transparent conductive layers.

3. The method according to claim 2, wherein the mask plate further comprises a first frame, and the first frame is configured to abut against the first doped layer to mask a margin region of the first doped layer, thereby exposing the margin region of the first doped layer out from the plurality of first transparent conductive layers.

4. The method according to claim 1, wherein the first non-conductive antireflection layer covers the surface of the first doped layer away from the substrate beyond the first transparent conductive layers.

5. The method according to claim 1, wherein the plurality of first transparent conductive layers are formed in an array, and cutting the solar cell structure along the region to be cut comprises:
   cutting the solar cell structure along a row direction and/or a column direction of the array.

6. The method according to claim 1, further comprising:
   forming a second doped layer on a surface of the substrate away from the first doped layer, wherein the doping type of the second doped layer is opposite to the doping type of the first doped layer; and forming at least one second transparent conductive layer on a surface of the second doped layer away from the substrate.

7. The method according to claim 6, further comprising:

forming a second non-conductive antireflection layer on a surface of the second doped layer away from the substrate, wherein the at least one second transparent conductive layer is a plurality of second transparent conductive layers, the second non-conductive antireflection layer is located between two adjacent second transparent conductive layers to space the two adjacent second transparent conductive layers from each other;

wherein a size of the region to be cut between the two adjacent second transparent conductive layers is smaller than a size of the second non-conductive antireflection layer between the two adjacent second transparent conductive layers.

8. The method according to claim 6, further comprising:

forming a second passivation layer between the second doped layer and the substrate; and forming at least one second electrode on a side of the at least one second transparent conductive layer away from the second doped layer.

9. The method according to claim 1, further comprising:

forming a first passivation layer between the first doped layer and the substrate; and forming first electrodes on a side of the plurality of first transparent conductive layers away from the first doped layer;

wherein at least one first electrode is formed on a side of each of the plurality of first transparent conductive layers away from the first doped layer.

10. A method for preparing a solar cell, comprising:

providing a substrate;

forming a first doped layer on a surface of the substrate;

forming a second doped layer on a surface of the substrate away from the first doped layer, wherein the doping type of the second doped layer is opposite to the doping type of the first doped layer;

forming a plurality of first transparent conductive layers spaced apart from each other on a surface of the first doped layer away from the substrate;

forming a plurality of second transparent conductive layers on a surface of the second doped layer away from the substrate;

forming a second non-conductive antireflection layer on a surface of the second doped layer away from the substrate, wherein the second non-conductive antireflection layer is located between two adjacent second transparent conductive layers to space the two adjacent second transparent conductive layers from each other, thereby achieving a solar cell structure;

cutting the solar cell structure along a region to be cut, wherein the region to be cut is located between two adjacent first transparent conductive layers and between the two adjacent second transparent conductive layers;

wherein a size of the region to be cut between the two adjacent second transparent conductive layers is smaller than a size of the second non-conductive antireflection layer between the two adjacent second transparent conductive layers.

11. The method according to claim 10, further comprising:

forming a second passivation layer between the second doped layer and the substrate; and forming at least one second electrode on a side of the at least one second transparent conductive layer away from the second doped layer.

* * * * *